United States Patent [19]

Fletcher et al.

[11] Patent Number: 5,754,088
[45] Date of Patent: May 19, 1998

[54] PLANAR TRANSFORMER AND METHOD OF MANUFACTURE

[75] Inventors: David Robert Fletcher, Coldwater; John Michael Gallagher, London, both of Canada; Terry Chester Lahr, Friendsville, Pa.; Garey George Roden, Apalachin, N.Y.; James Jens Hansen, Huntington, Ind.; Kenneth Andrew Wallace, Lewis Center, Ohio

[73] Assignee: International Business Machines Corporation, Armonk, N.Y.

[21] Appl. No.: 342,057

[22] Filed: Nov. 17, 1994

[51] Int. Cl.⁶ .................................................. H01F 5/00
[52] U.S. Cl. .................................................. 336/200
[58] Field of Search ........................................ 336/200

[56] References Cited

U.S. PATENT DOCUMENTS 5,321,380  6/1994  Godek et al. .................. 336/200

FOREIGN PATENT DOCUMENTS 0 428 142 A3  5/1991  European Pat. Off. .
2 087 656   5/1982  United Kingdom .
2 173 956  10/1986  United Kingdom .
WO 91/15861 10/1991  WIPO .

OTHER PUBLICATIONS van der Linde et al., Design of a High–Frequency Planar Power Transformer in Multilayer Technology, IEEE Transactions on Industrial Electronics, vol. 38, No. 2, pp. 135–141 (Apr. 1991).

Patent Abstracts of Japan, vol. 15, No. 29 (E–1026), and JP–A–02 272793 (Asahi Print Kogyo KK) (Jan. 1991).

Primary Examiner—Cassandra C. Spyrou
Assistant Examiner—Daniel Chapik
Attorney, Agent, or Firm—Pollock, Vande Sande & Priddy

[57] ABSTRACT

A planar transformer wherein a conformal dielectric epoxy composition is provided on the planes containing the primary and secondary windings to encapsulate the windings and to insulate the windings from the perimeter of each plane to prevent the primary windings from electrically contacting the secondary windings around the edges of the planes. Also, a conformal dielectric epoxy composition separates the plane with the primary windings from the plane with the secondary windings from primary and secondary circuits directly and below windings.

20 Claims, 8 Drawing Sheets

PLANAR TRANSFORMER AND METHOD OF MANUFACTURE

TECHNICAL FIELD

The present invention is concerned with a planar transformer, and more particularly, is concerned with a transformer that permits reduced spacing requirements. This makes it possible to include more circuitry and thus higher current carrying capability for the same size transformer. In particular, according to the present invention, a conformal dielectric epoxy composition is provided on the planes containing the windings to encapsulate the windings. The epoxy composition also insulates the perimeter of the planes to prevent the windings from contacting each other around the edges of the planes. A conformal dielectric epoxy composition is also provided to separate the planes from each other.

Also included in the construction is the ability to meet the "three insulation" requirements of safety standards by means of considering one layer of epoxy/glass prepreg as one layer of insulation. Additional construction advantages include the ability to include primary and/or secondary circuitry directly over and/or under the planar transformer on the same raw card.

BACKGROUND ART

In fabricating a transformer, there are certain safety standards that must be met before it is considered acceptable. One standard currently followed by many manufacturers is IEC-950. By way of example, when the primary voltage of the transformer is 400 volts, this safety standard as shown in Table 6 thereof requires about 8 mm of creepage distance (non-metallized distance) between the primary voltage circuitry and the secondary voltage circuitry.

Such would require that at least about 4 mm of creepage be provided from the perimeter or edge of the card to the circuitry. However, in order to meet this requirement in a single printed circuit board planar transformer where the primary windings and secondary windings are on the same circuit card would significantly reduce its transformer performance, since much of the card would have to be free from circuitry.

One way to avoid this problem has been to use a standard non-planar discrete type transformer assembly. This type employs separate primary and secondary components with isolation materials between them. However, this construction is more difficult to fabricate than a planar circuit card transformer and thus potentially more expensive, in addition to the required adherence to the relatively large spacings of Table 6 of standard IEC-950.

Transformers, planar and otherwise, have also been produced using conformal coatings that are applied to the exposed edges of the primary and secondary circuits that reduce the creepage spacings significantly (e.g., −8 mm to 2 mm for the 400 volt example mentioned above). However, this material must be added in a separate operation and is therefore potentially more costly.

Methods for isolating through insulation include two layers of tape, mylar or other insulating materials that are safety agency approved.

SUMMARY OF INVENTION

The present invention allows for the greatly reduced primary to secondary windings spacing requirements listed in Table 7 of the standard IEC 950, as well as the corresponding tables in the UL, CSA and VDE safety standards, as contrasted to Table 6. This results in greater real estate on the planes of the integrated card for circuitry, and thus higher current carrying capability for the same size transformer. In addition, the present invention makes it possible to manufacture the winding portion of the transformer within the raw card manufacturing process, resulting in a more automatable and potentially less expensive transformer.

Concerning the above standards, Section 2.94 in UL 1950, Section 2.94 in Can/CSA-C22.2 No. 234-M90 and No. 950-93; and Section 2.94 in IEC 950 deal with layers of insulation between primary and secondary circuits. Section 2.95 of each of these standards deals with requirements of conformal coating in order to use Table 7.

In particular, the present invention is concerned with a planar transformer comprising at least one core set, and at least one circuit card containing at least a first plane containing primary electrically conductive windings, and at least a second plane containing secondary electrically conductive windings. In addition, at least one conformal dielectric layer of an epoxy composition is provided on each plane containing the windings to encapsulate the windings. The epoxy composition also insulates the windings from the perimeter of each plane. This prevents the primary windings from electrically contacting the secondary windings around the edges of the planes.

Also, a conformal dielectric epoxy composite separates the plane containing the primary winding from the plane containing the secondary windings.

BEST AND VARIOUS MODES FOR CARRYING OUT INVENTION

In order to facilitate an understanding of the present invention, reference is made to the drawings.

Figure 1:
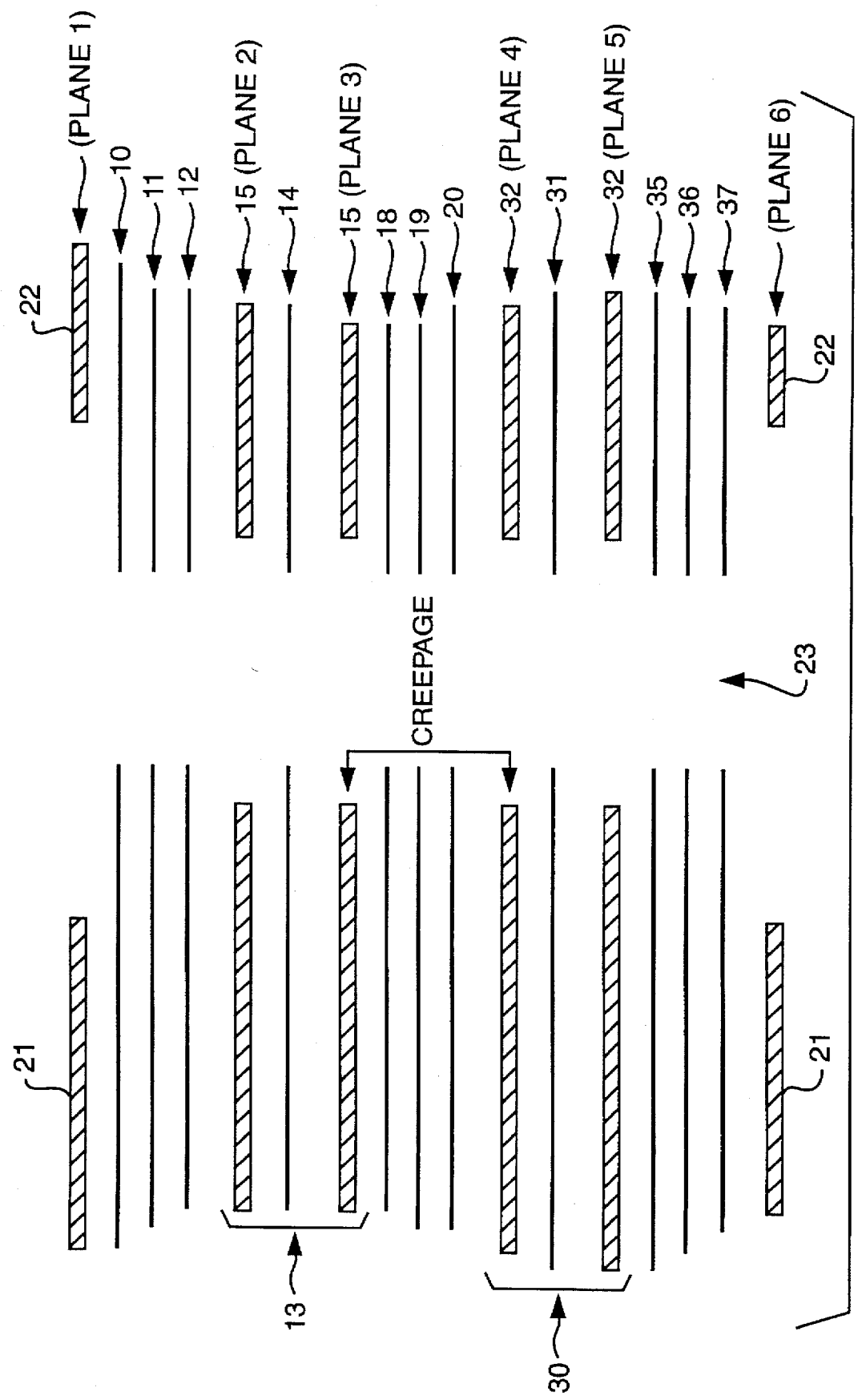
FIG. 1 is a schematic illustration of an arrangement of planes employed pursuant to the present invention.
Figure 2:
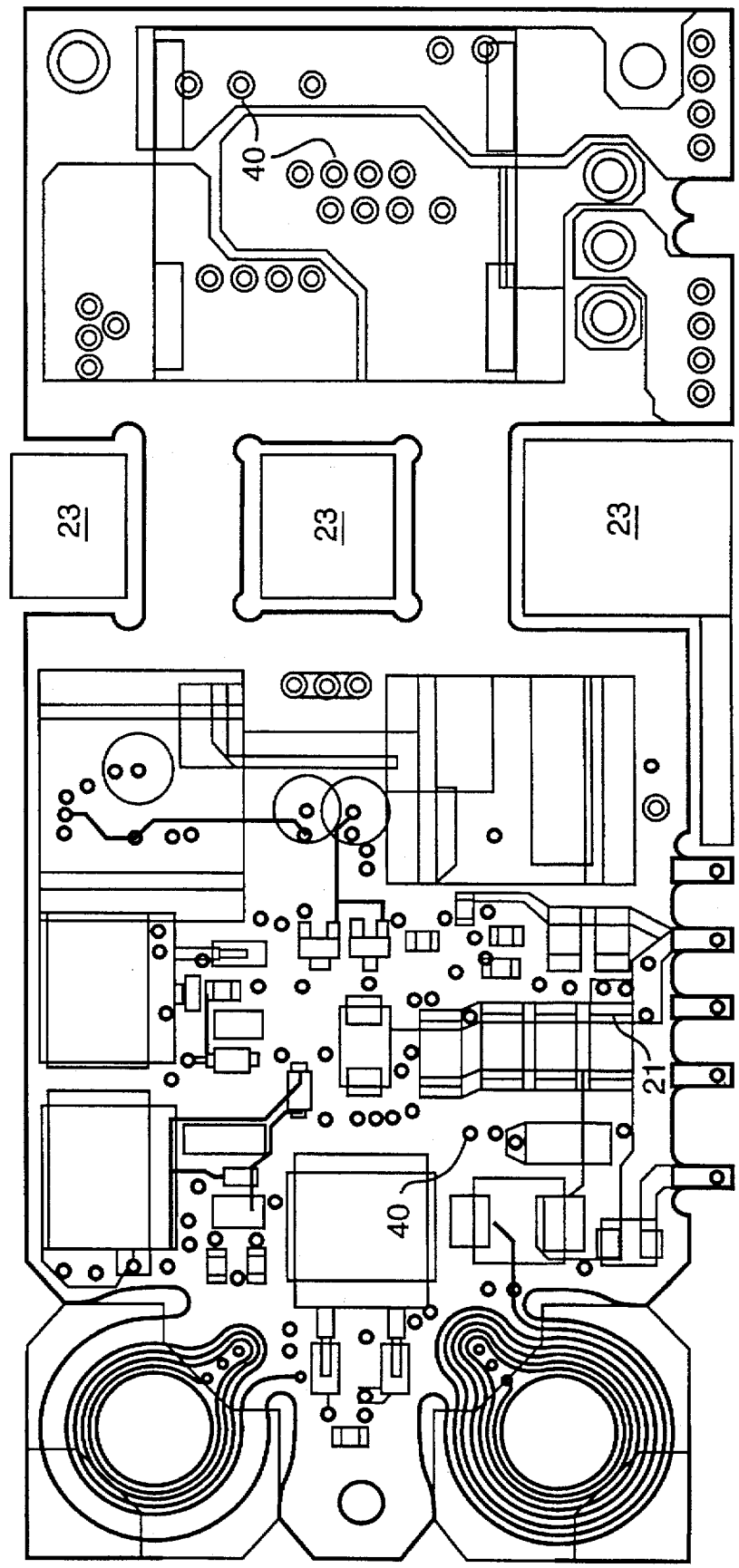
FIGS. 2–7 are examples of individual layers that can be employed in the transformer of the present invention.

In particular, FIG. 1 is a schematic illustration of an arrangement of the planes employed pursuant to the present invention for the integrated circuit card of a planar transformer.

This arrangement is quite suitable for a transformer wherein the incoming voltage is typically 400 volts, and the outgoing voltage is 5 volts.

Figure 9:
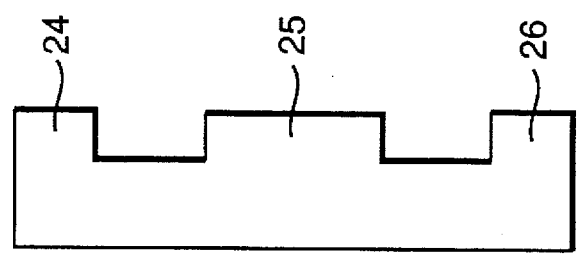
FIG. 9 is a schematic illustration of an unassembled half of the core of FIG. 9.
Figure 8:
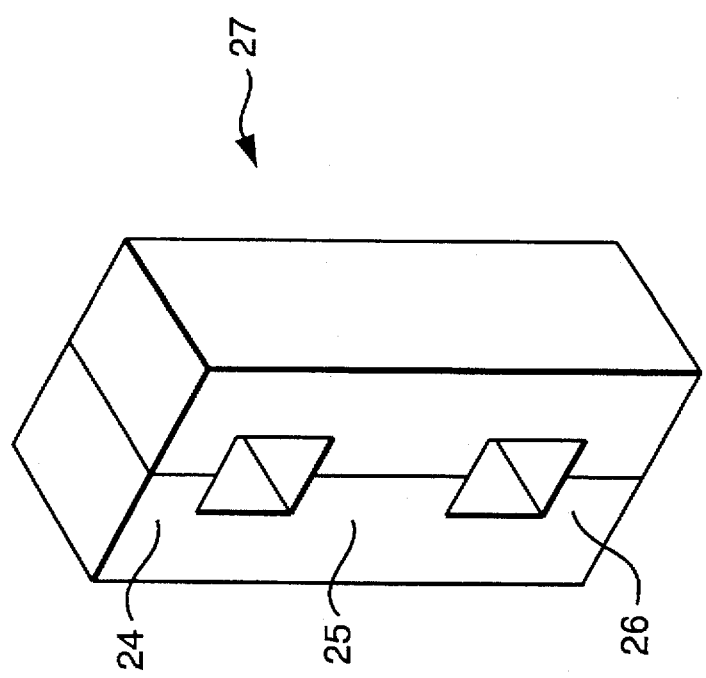
FIG. 8 is an isometric view of an assembled magnetic core used in the present invention.

The integrated circuit card has a top plane 1 and bottom plane 6, each of which carries control input 21 and output circuitry 22, but no transformer windings. As illustrated in FIGS. 2–7, each plane also includes cutouts or openings 23 for receiving legs 24, 25 and 26 of core set 27 (see FIGS. 8 and 9). Planes 1 and 6 are usually about 0.001 inch to about 0.005 inch thick, and more usually, about 0.002 inch to about 0.0042 inch thick, a typical example being about 0.0027 inches thick. The circuitry 21 and 22 can be provided by copper lines such as by 1 ounce copper.

Layers 10, 11 and 12 are conformal dielectric layers of epoxy composition that provide electrical insulation. The layers are each usually about 0.0025 inches to about 0.0055 inches, typical of which is about 0.003 inches thick before assembling. Upon lamination, the combined thickness of layers 10, 11 and 12 is usually about 0.005 inch to about 0.007 inch, typically of which is about 0.006 inches.

Figure 3:
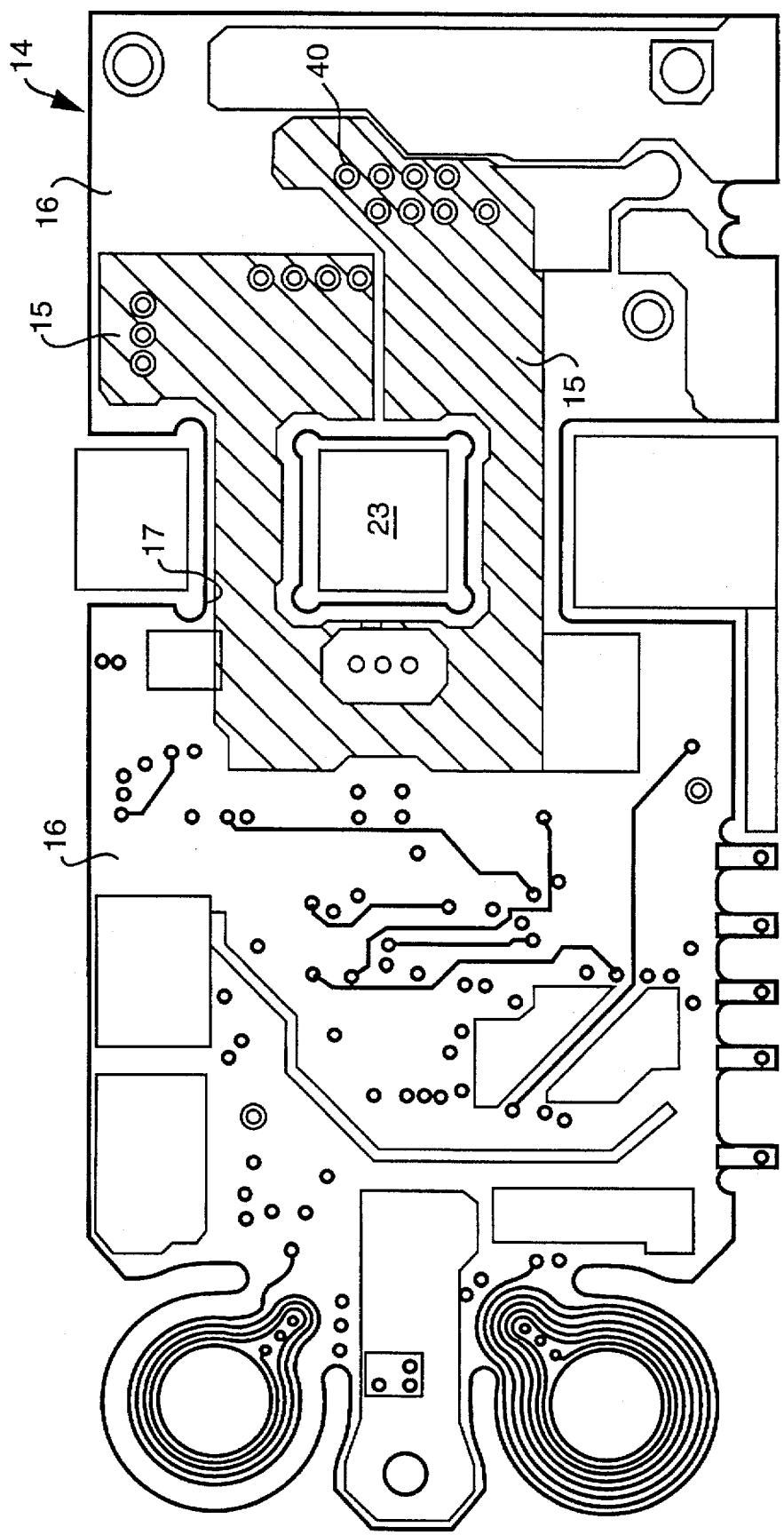

A secondary windings subassembly 13 is provided adjacent layer 12. The subassembly 13 is comprised of a dielectric epoxy composition substrate 14 having secondary windings 15 on a top plane 2 and secondary windings 15 on a bottom plane 3 thereof. The windings, such as 3 ounce copper, as shown in FIG. 3, make one turn around the middle of opening 23 and when assembled leg 25 of the core to fill the core window between the card edges of the cutouts that accept the core. The substrate 14 is usually about 0.002 inches to about 0.020 inches thick, more usually about 0.005 inches to about 0.015 inches thick, typical of which is about 0.01 inches.

Figure 4:
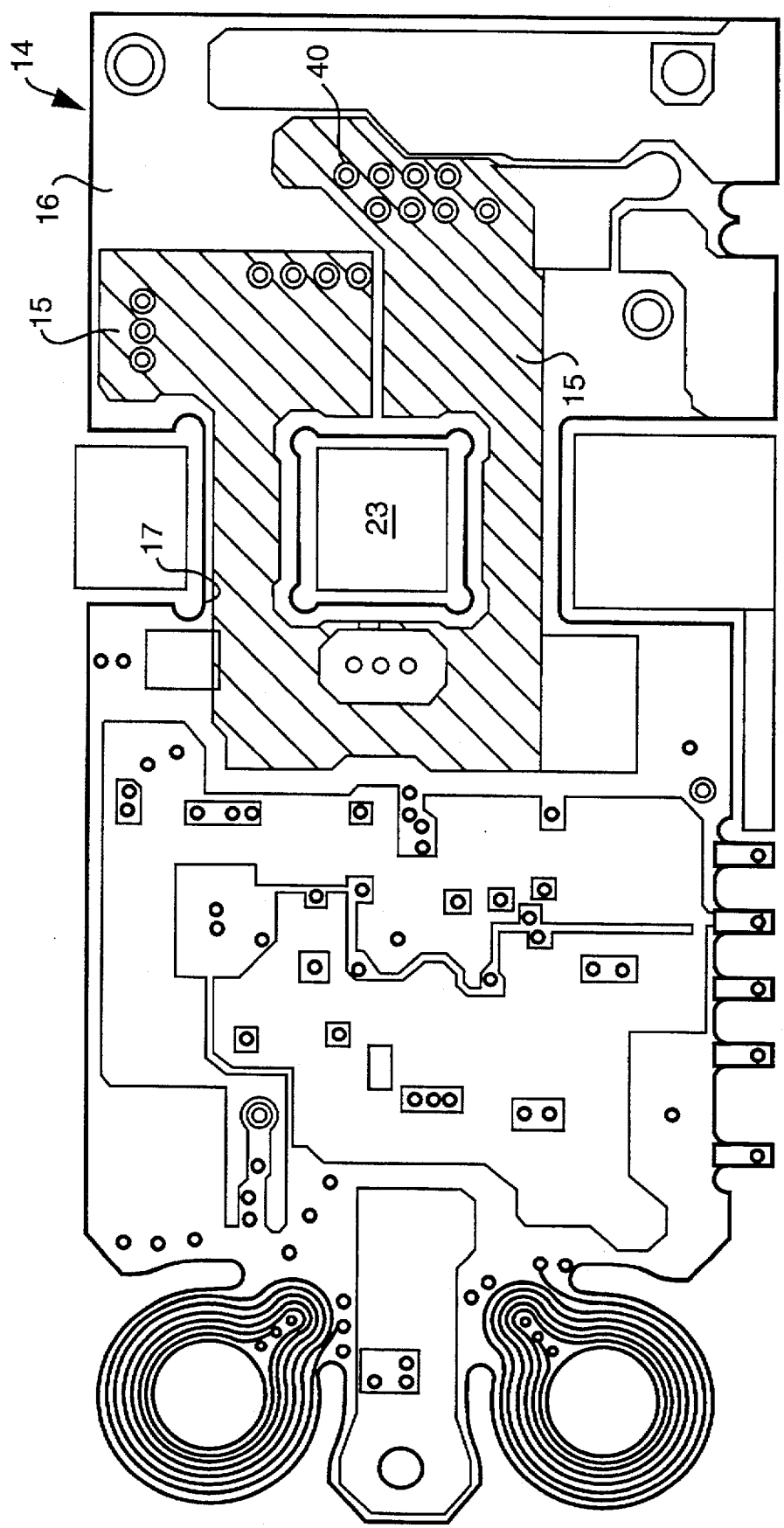

Also located on planes 2 and 3 between and encapsulating the windings and other circuitry thereon is a conformal dielectric layer of epoxy composition 16 (see FIGS. 3 and 4). The epoxy composition isolates the windings from the edges or perimeter of the planes 2 and 3. The layer 16 is of sufficient thickness to completely encapsulate the windings. The layer is preferably provided during the fabrication of the card during lamination as will be discussed below.

The epoxy layer, because of its insulating characteristics, makes it possible in the typical example given to reduce the creepage spacing 17 between the windings and perimeter of each planes 2 and 3 to about 1 mm as compared to 4 mm, as required without such insulation. In input voltages less than 400, the creepage spacing can be reduced even further, such as to about 0.7 mm.

Located beneath subassembly 13 is conformal dielectric layer 18 of epoxy compositions. In this embodiment, conformal dielectric layers 19 and 20 of epoxy composition are also provided to provide electrical insulation between the primary and secondary windings. The layers 18, 19 and 20 are each usually about 0.0025 inches to about 0.0055 inches, typical of which is about 0.003 inches thick before assembly. Upon lamination combined thickness of the layers 18, 19, and 20 is about 0.005 inches to about 0.006 inches, typical of which is about 0.006 inches.

Figure 5:
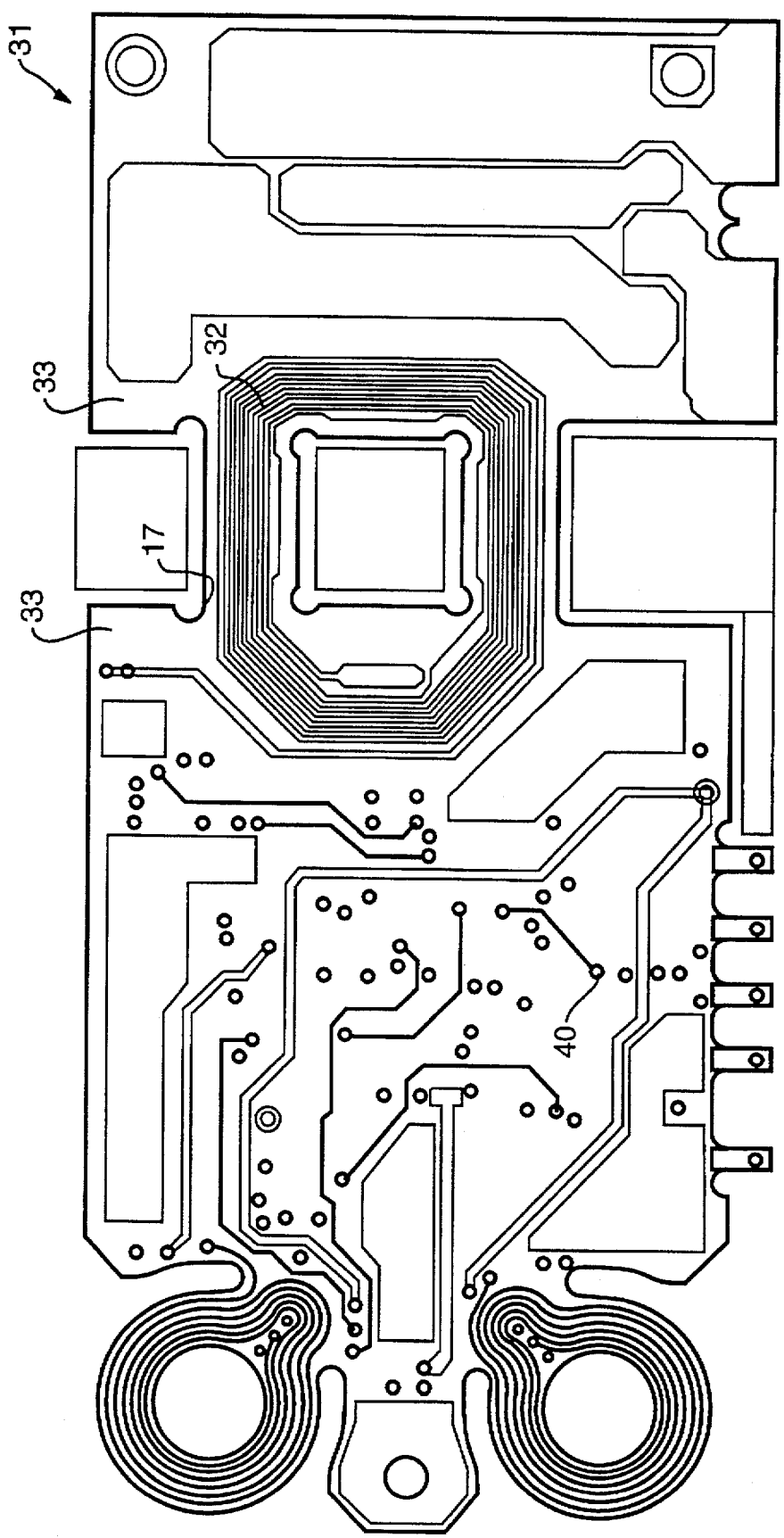
Figure 6:
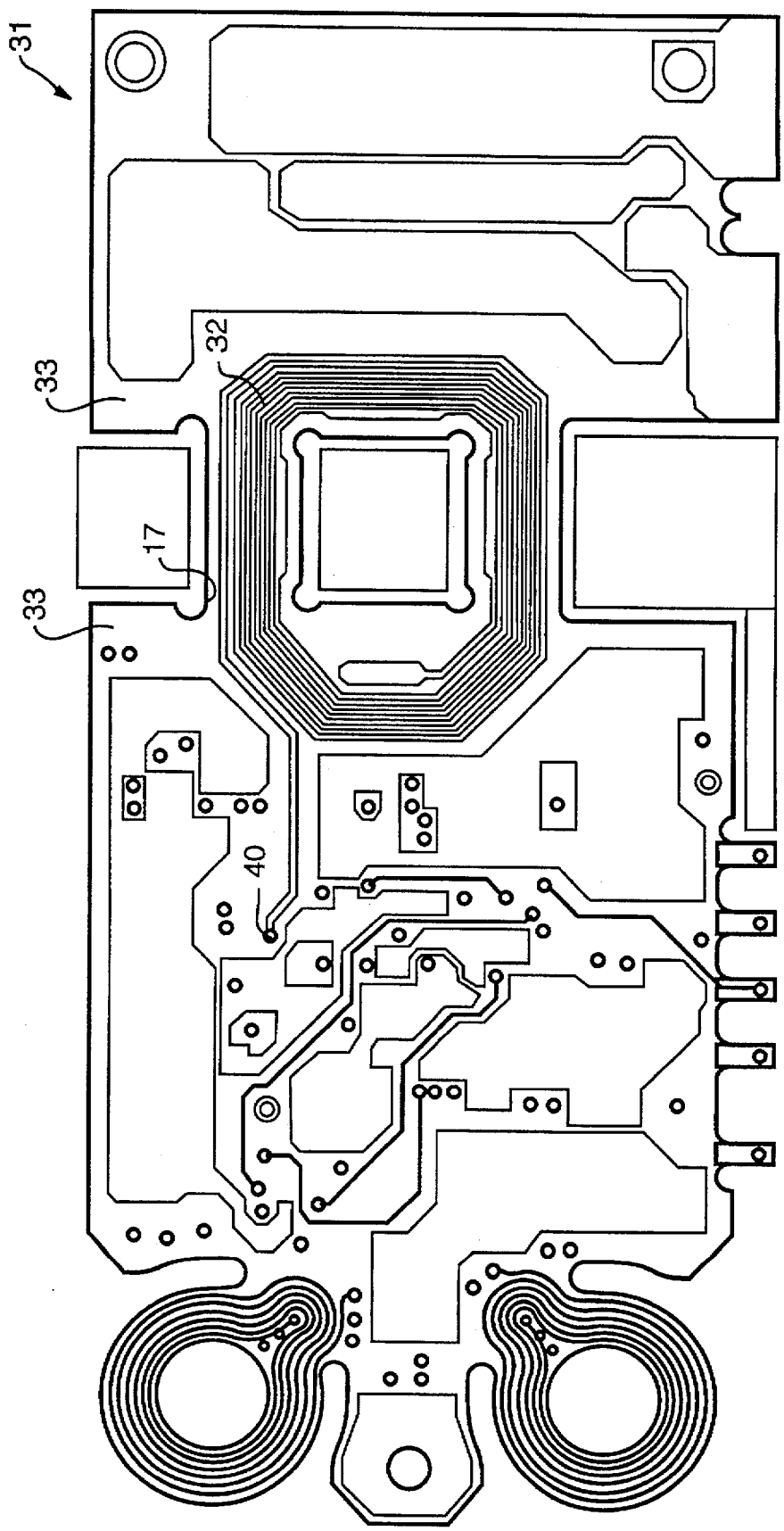
Figure 7:
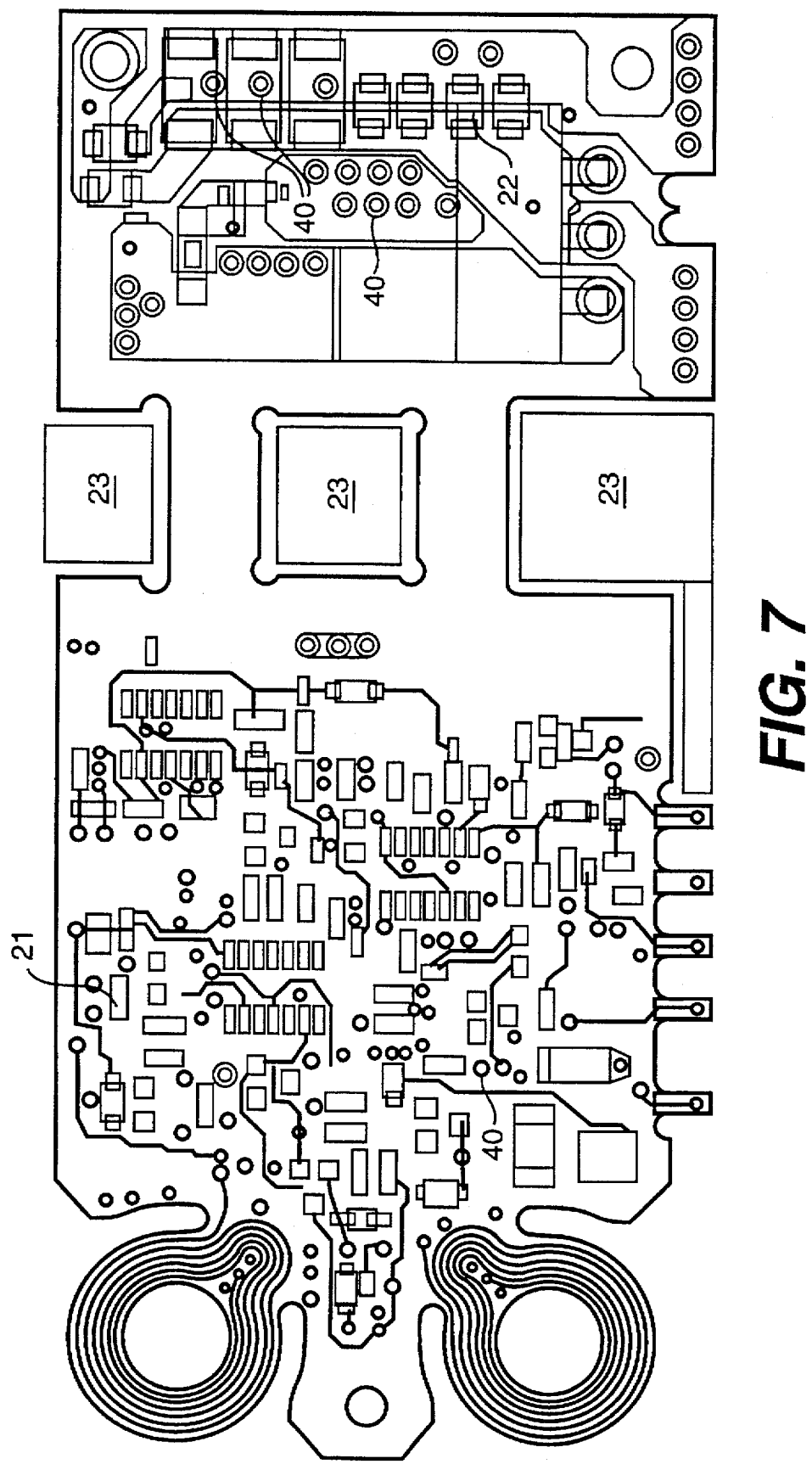

A primary windings subassembly 30 is provided adjacent layer 20. The subassembly 30 is comprised of a dielectric epoxy composition substrate 31 having primary windings 32 on a top plane 4 and primary windings 32 on a bottom plane 5 thereof. The windings, such as 3 ounce copper, as shown in FIGS. 4 and 5, make a total of 13 turns around the middle of opening 23 and when assembled leg 25 of the core to fill the core window between the card edges of the cutouts that accept the core. The substrate 30 is usually about 0.002 inches to about 0.030 inches thick, more usually about 0.005 inches to about 0.015 inches thick, typical of which is about 0.01 inches.

Also located on planes 4 and 5 between the encapsulating windings and other circuitry thereon is a conformal dielectric layer of epoxy composition 33. The epoxy composition isolates the windings from the edges or perimeter of the planes 4 and 5. The layer 33 is of sufficient thickness to completely encapsulate the windings. The layer is preferably provided during the fabrication of the card during lamination as will be discussed below.

The epoxy layer, because of its insulating characteristics, makes it possible in the typical example given to reduce the creepage spacing 17 between the windings and perimeter of each planes 4 and 5 to about 1 mm as compared to 4 mm, as required without such insulation. In input voltages less than 400, the creepage spacing can be reduced even further, such as to about 0.7 mm.

Located beneath subassembly 30 is layer 35 followed by layers 36 and 37. Layers 35, 36 and 37 are conformal dielectric layers of epoxy composition that provide electrical insulation. The layers are each usually about 0.0025 inches to about 0.0055 inches, typical of which is about 0.003 inches thick before assembling. Upon lamination, the combined thickness of layers 35, 36 and 37 is usually about 0.006 inches to about 0.007 inches, typical of which is about 0.006 inches.

Located beneath layer 30 is provided bottom plane 6 that carries control input circuitry 21 and output circuitry 22, but no transformer windings.

The conformal dielectric layers are obtained from epoxy resin compositions reinforced with reinforcing agents, such as fiber glass and are typically FR-4 epoxy compositions, such as PCL-FR-226 commercially available from polyclad. PCL-FR-226 is a glass fabric reinforced epoxy composition of tetrafunctional epoxy polymer and difunctional epoxy polymer. A particular prepreg available from polyclad is 1080 . Other suitable FR-4 epoxy compositions are disclosed in U.S. Pat. Nos. 3,523,037, 4,550,128, 4,597,996 and 5,143,756 entire disclosures of which are incorporated herein by reference.

Typical FR-4 epoxy compositions that can be used in the present invention contain 70–90 parts of brominated polyglycidyl ether of bisphenol-A and 10–30 parts of tetrakis (hydroxyphenyl) ethane tetraglycidyl ether cured with 3–4 parts of dicyanadiamide, and 0.2–0.4 parts of a tertiary amine, all parts being parts by weight per hundred parts of resin solids.

Another typical FR-4 epoxy composition contains about 25 to about 30 parts by weight of a tetrabrominated diglycidyl ether of bisphenol-A having an epoxy equivalent weight of about 350 to about 450; about 10 to about 15% by weight of a tetrabrominated glycidyl ether of bisphenol-A having an epoxy equivalent weight of approximately 600 to about 750; and about 55 to about 65 parts per weight of at least one epoxidized nonlinear novolak having at least 6 terminal epoxy groups; along with suitable curing and/or hardening agents.

A still further FR-4 epoxy composition contains 70 to 90 parts of brominated polyglycidyl ether of bisphenol-A and 10 to 30 parts of tetrakis (hydroxyphenyl) ethane tetraglycidyl ether cured with 0.8–1 phr of 2-methylimidazole. Still another FR-4 epoxy composition employs tetrabromobisphenol-A as the curing agent, along with 2-methylimidazole as the catalyst.

Electrical contact between planes where required can be provided by plated through holes 40.

In preparing each of the dielectric layers, and primary windings and secondary windings subassemblies, a fibrous substrate, such as glass fiber, can be coated and impregnated with an FR-4 epoxy composition.

Conventional coating equipment can be employed. Subsequent to coating, the impregnated substrate is dried and partially cured at a temperature of about 140° C. to about 160° C. for about 2 to about 6 minutes to form a dry substrate called a prepreg.

The epoxy composition at this stage is in the B-stage which is about 30% to about 50% cross-linked.

After the prepreg is formed, for those substrates that will contain circuitry, a sheet of copper or other conductive material can then be laminated to one or more layers of prepreg using conventional laminating conditions. Then a circuit can be etched to the conductive layer using techniques well-known to form the desired circuitry.

Typically, the circuitry for planes 1 and 6 will be carried out after final assembling of all of the layers of the circuit card.

The various component layers of the desired circuit card are arranged in their desired order and laminated under pressure and heat pressure and heat to provide laminated composite. During this lamination, the epoxy composition present will fill the space where the copper has been etched away, thereby encapsulating the copper lines.

The following is a typical process sequence (5 steps) for carrying out the lamination:
Step
1 30 minute vacuum draw—no heat or pressure during this segment
2 close press to 175 PSI—begin heat rise at 8 degrees/min. up to 340 F.
3 35 minute cure at 340-360 F. at 175 PSI
4 20 minute final cure at 25 PSI—hold temp.
5 cool down—55 minutes at<8 degrees/min.

The core is placed and secured in the windows. The core is typically a ferrite core.

What is claimed is:

1. A planar transformer comprising at least one core set and at least one integrated circuit card containing a plurality of planes wherein at least a first plane contains primary electrically conductive windings and at least a second plane contains secondary electrically conductive windings;

at least one conformal dielectric layer of epoxy composition on each of the planes containing the primary windings and the secondary windings to encapsulate the windings and to insulate the windings from the perimeter of each plane of said plurality of planes to prevent the primary windings from electrically contacting the secondary windings around the edges of said planes; and at least one conformal dielectric layer of epoxy composition separating the at least first plane containing the primary windings from the at least second plane containing the secondary windings to electrically isolate the primary windings from the secondary windings.

2. The planar transformer of claim 1 wherein the dielectric layers of epoxy ar FR-4 epoxy compositions.

3. The planar transformer of claim 1 wherein the first plane and second plane have creepage spacing between said primary windings and the edges of said planes and between secondary windings and the edges of said planes of about 1 mm.

4. The planar transformer of claim 1 wherein said dielectric layers of epoxy have a thickness of up to about 8000 Å.

5. The planar transformer of claim 1 wherein the secondary windings comprise at least two planes separated by a dielectric epoxy substrate and the primary windings comprise at least two planes separated by a dielectric epoxy substrate.

6. The planar transformer of claim 5 wherein the thickness of the dielectric layer separating the plane containing the primary windings from the plane containing the secondary windings is at least about 0.005 inches.

7. The planar transformer of claim 6 wherein at least about three layers of epoxy composition are provided between the plane containing the primary windings and the plane containing the secondary windings.

8. The planar transformer of claim 1 wherein the dielectric layer of epoxy composition on each of the planes containing the primary windings and secondary windings is obtained from the dielectric layer of epoxy composition separating the plane containing the primary windings from the plane containing the secondary windings.

9. The planar transformer of claim 1 wherein said core set is a three legged core set and wherein said integrated circuit card has windows for receiving the legs of said core.

10. The planar transformer of claim 1 wherein said core set is a magnetic ferrite.

11. The planar transformer of claim 1 wherein the dielectric layers of epoxy composition encapsulating the windings provide for satisfying requirements of Table 7 and Section 2.94 of standard IEC 950.

12. A method for fabricating an integrated circuit card including a plurality of planes, said method comprising:

providing a first assembly comprising an epoxy prepreg substrate containing on at least one major surface thereto primary windings, providing a second assembly comprising an epoxy prepreg substrate containing on at least one major surface thereof secondary windings, providing at least one epoxy prepreg substrate between the plane primary windings and secondary windings, providing an epoxy prepreg substrate covering each surface of said first and second assemblies that contains windings, pressing together the layers of the first and second assemblies and then subjecting the layers to temperature and under a pressure for a time sufficient to cure the epoxy of the prepreg substrates, and to cause epoxy from prepreg substrates to encapsulate the windings.

13. The planar transformer of claim 1 which further includes a plane containing input and output circuitry located above and beneath the plane containing the secondary windings and a plane containing input and out circuitry located above and beneath the plane containing the primary windings.

14. The planar transformer of claim 13 which further includes a surface mount inductor located above or beneath the said windings such that one side of the inductor is attached to the center top of a multi-turn center top secondary winding.

15. A planar transformer of claim 1 wherein the use of at least one layer of epoxy composition provides for meeting isolation requirements of IEC 950, UL or CSA standards from primary and secondary windings to the core set.

16. A planar transformer of claim 1 wherein the use of at least one layer of epoxy composition provides for meeting isolation requirements of IEC 950, UL or CSA standards from primary and secondary windings to primary and secondary circuits located on outer planes of raw card.

17. The planar transformer of claim 2 wherein the dielectric layer of epoxy composition or system of epoxy composition between primary and secondary circuits provides for satisfying one layer of the three insulation requirements of Section 2.94 in IEC 950, and associated UL standard.

18. The planar transformer of claim 13 providing isolation between primary or secondary winding and the circuitry located on planes above or below either or both windings.

19. The planar transformer of claim 13 with more than 1 primary winding or more than 1 secondary winding with each winding isolated in the manner of the primary and secondary as described in claim 13.

20. The planar transformer of claim 13 with multiple vias from either or both, the primary or secondary windings to the card surface with proper spacing from via to other surface circuitry.

* * * * *